(12) United States Patent  
Griffin et al.

(10) Patent No.: US 7,795,045 B2  
(45) Date of Patent: Sep. 14, 2010

(54) TRENCH DEPTH MONITOR FOR SEMICONDUCTOR MANUFACTURING

(75) Inventors: Hugh J. Griffin, Newtownabbey (GB); Takeshi Ishiguro, Aizuwakamatsu (JP); Kenji Sugiura, Kawasaki (JP)

(73) Assignee: Icemos Technology Ltd., Belfast (GB)

( * ) Notice: Subject to any disclaimer, the term of this patent is extended or adjusted under 35 U.S.C. 154(b) by 7 days.

(21) Appl. No.: 12/371,021

(22) Filed: Feb. 13, 2009

(65) Prior Publication Data

US 2009/0200547 A1  Aug. 13, 2009

Related U.S. Application Data

(60) Provisional application No. 61/028,321, filed on Feb. 13, 2008.

(51) Int. Cl.  
*H01L 21/00* (2006.01)  
*G01R 31/26* (2006.01)

(52) U.S. Cl. .................. 438/9; 438/16; 257/E21.526; 257/E21.528; 257/E21.546; 257/E21.577

(58) Field of Classification Search ........... 438/8, 438/9, 14, 16; 257/E21.526, E21.528, E21.546, 257/E21.577  
See application file for complete search history.

(56) References Cited

U.S. PATENT DOCUMENTS

| | | | |
|---|---|---|---|
| 3,497,777 A | 2/1970 | Tesgner | |
| 4,367,044 A * | 1/1983 | Booth et al. | 356/504 |
| 4,491,486 A | 1/1985 | Iwai | |
| 4,994,406 A | 2/1991 | Vasquez et al. | |
| 5,216,275 A | 6/1993 | Chen | |
| 5,337,144 A | 8/1994 | Strul et al. | |
| 5,395,790 A | 3/1995 | Lur | |
| 5,438,215 A | 8/1995 | Tihanyi | |
| 5,728,253 A * | 3/1998 | Saito et al. | 156/345.25 |
| 5,854,135 A | 12/1998 | Ko | |

(Continued)

FOREIGN PATENT DOCUMENTS

JP  2000292129  * 10/2000

OTHER PUBLICATIONS

Chenming Hu; "Optimum Doping Profile for Minimum Ohmic Resistance and High-Breakdown Voltage;" IEEE Transaction on Electron Devices, vol. ED-26, No. 3, pp. 243-244; Mar. 1979.

(Continued)

*Primary Examiner*—Walter L Lindsay, Jr.  
*Assistant Examiner*—Ron Pompey  
(74) *Attorney, Agent, or Firm*—Panitch Schwarze Belisario & Nadel LLP

(57) ABSTRACT

A method of manufacturing a semiconductor wafer having at least one device trench extending to a first depth position includes providing a semiconductor substrate having first and second main surfaces and a semiconductor material layer having first and second main surfaces disposed on the first main surface of the semiconductor substrate and determining an etch ratio. The least one device trench and at least one monitor trench are simultaneously formed in the first main surface of the semiconductor material layer. The at least one monitor trench is monitored to detect when it extends to a second depth position. A ratio of the first depth position to the second depth position is generally equal to the etch ratio.

22 Claims, 4 Drawing Sheets

U.S. PATENT DOCUMENTS

| | | | |
|---|---|---|---|
| 5,900,644 | A * | 5/1999 | Ying et al. .............. 257/48 |
| 5,926,713 | A | 7/1999 | Hause et al. |
| 6,066,878 | A | 5/2000 | Neilson |
| 6,081,009 | A | 6/2000 | Neilson |
| 6,127,237 | A * | 10/2000 | Tsuchiaki .............. 438/381 |
| 6,174,773 | B1 | 1/2001 | Fujishima |
| 6,184,555 | B1 | 2/2001 | Tihanyi et al. |
| 6,291,856 | B1 | 9/2001 | Miyasaka et al. |
| 6,300,171 | B1 | 10/2001 | Frisina |
| 6,307,246 | B1 | 10/2001 | Nitta et al. |
| 6,362,505 | B1 | 3/2002 | Tihanyi |
| 6,410,958 | B1 | 6/2002 | Usui et al. |
| 6,495,421 | B2 | 12/2002 | Luo |
| 6,504,230 | B2 | 1/2003 | Deboy et al. |
| 6,512,267 | B2 | 1/2003 | Kinzer et al. |
| 6,545,753 | B2 | 4/2003 | Subramanian et al. |
| 6,566,201 | B1 | 5/2003 | Blanchard |
| 6,624,494 | B2 | 9/2003 | Blanchard et al. |
| 6,650,426 | B1 | 11/2003 | Zalicki |
| 6,686,244 | B2 | 2/2004 | Blanchard |
| 6,686,270 | B1 | 2/2004 | Subramanian et al. |
| 6,687,014 | B2 | 2/2004 | Zaidi et al. |
| 6,710,403 | B2 | 3/2004 | Sapp |
| 6,710,418 | B1 | 3/2004 | Sapp |
| 6,720,229 | B2 * | 4/2004 | Norstrom et al. .......... 438/381 |
| 6,812,525 | B2 | 11/2004 | Bul et al. |
| 6,979,862 | B2 | 12/2005 | Henson |
| 7,015,104 | B1 | 3/2006 | Blanchard |
| 7,023,069 | B2 | 4/2006 | Blanchard |
| 7,041,560 | B2 | 5/2006 | Hshieh |
| 7,052,982 | B2 | 5/2006 | Hshieh et al. |
| 7,109,110 | B2 * | 9/2006 | Hshieh .............. 438/653 |
| 2002/0070418 | A1 | 6/2002 | Kinzer et al. |
| 2005/0116313 | A1 | 6/2005 | Lee et al. |
| 2005/0176192 | A1 | 8/2005 | Hshieh |
| 2005/0242411 | A1 | 11/2005 | Tso |
| 2007/0221619 | A1 | 9/2007 | Cheng |

OTHER PUBLICATIONS

Rossel, P.; "Power M.O.S. Devices; Microelectron;" Reliab., vol. 24, No. 2, pp. 339-366; 1984.

Temple, Victor A.K. et al.; "A 600-Volt MOSFET Designed for Low On-Resistance;" IEEE Transactions on Electron Devices, vol. Ed-27, No. 2, pp. 343-349; Feb. 1980.

Fujihira, Tatsuhiko; "Theory of Semiconductor Superjunction Devices;" Jpn. J. Appl. Phys., vol. 36, pp. 6254-6262; 1997.

Yamauchi et al.; "Electrical Properties of Super Junction p-n- Diodes Fabricated by Trench Filling;" 15th International Symposium on Power Semiconductor Devices and ICs, pp. 207-210; 2003.

Saito et al.; "600V Semi-superjunction MOSFET;" Papers of Technical Meeting on Electron Devices; IEE Japan, vol. Ed. 03, No. 44-49, pp. 27-30; 2003.

Bai et al., "Junction Termination Technique for Super Junction Devices;" 12th International Symposium on Power Semiconductor Devices and ICs, pp. 257-261; 2000.

Daniel et al.; "Modeling of the CoolMOS Transistor—Part I: Device Physics;" IEEE Transactions on Electron Devices, vol. 49, No. 5, pp. 916-922; May, 2002.

Daniel, et al.; "Modeling of the CoolMOS Transistor—Part II: DC Model and Parameter Extraction;" IEEE Transactions on Electron Devices, vol. 49, No. 5, pp. 923-929; May, 2002.

Mawby, PA; "MOS Devices;" IGDS Course, University of Wales Swansea; 2003.

* cited by examiner

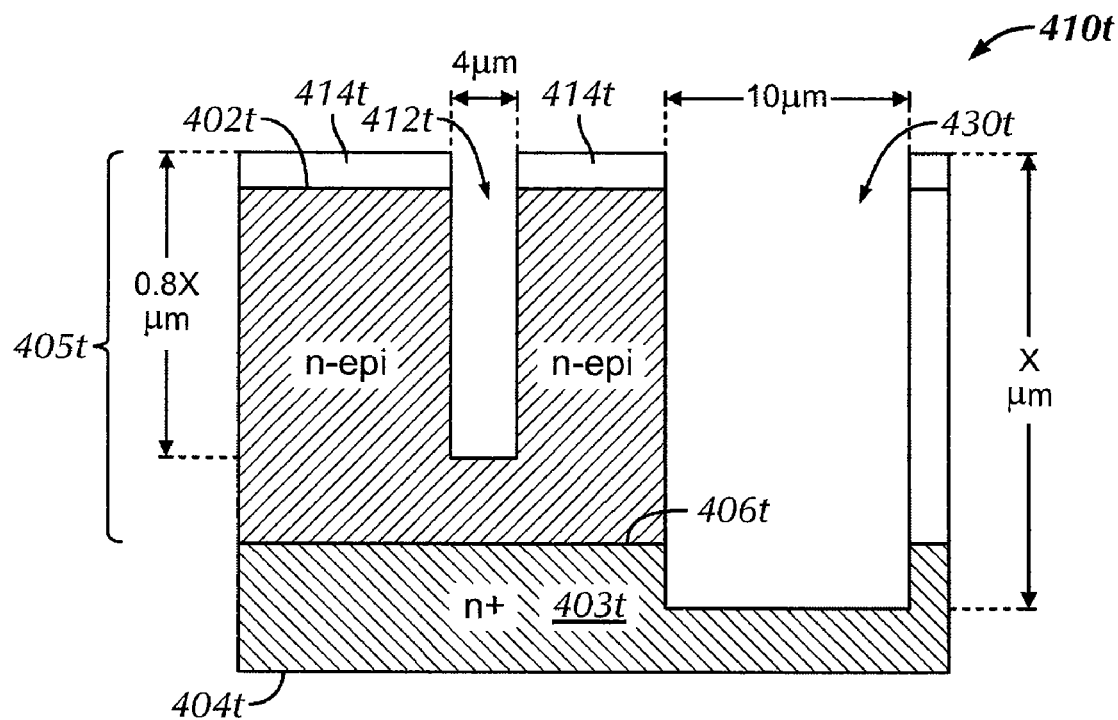
FIG. 4
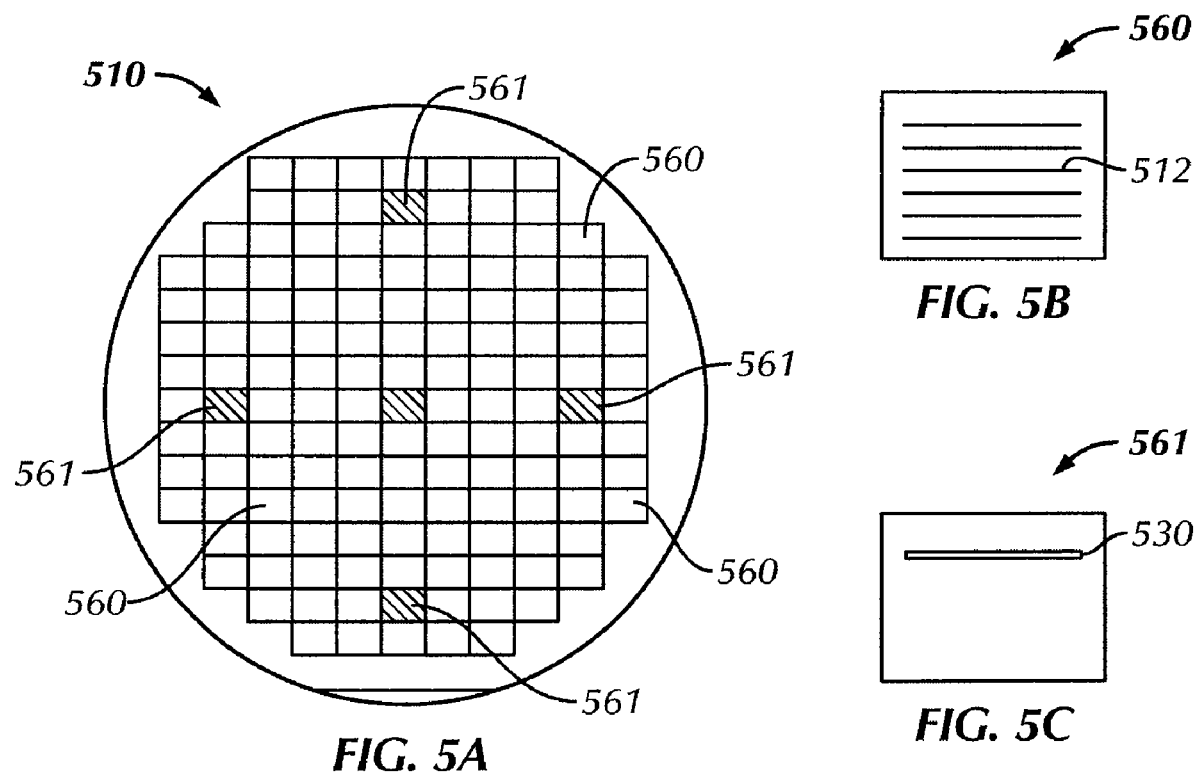
FIG. 5A
FIG. 5B
FIG. 5C

TRENCH DEPTH MONITOR FOR SEMICONDUCTOR MANUFACTURING

CROSS-REFERENCE TO RELATED APPLICATIONS

This application claims the benefit of U.S. Provisional Patent Application No. 61/028,321, filed Feb. 13, 2008, entitled "Trench Depth Monitor for Semiconductor Manufacturing," the entire contents of which are incorporated by reference herein.

BACKGROUND OF THE INVENTION

An embodiment of the present invention relates generally to a method of manufacturing a semiconductor device, and more particularly, to a method of manufacturing a semiconductor device by monitoring trench depth during processing.

Since the invention of superjunction devices by Dr. Xingbi Chen, as disclosed in U.S. Pat. No. 5,216,275, the contents of which are incorporated by reference herein, there have been many attempts to expand and improve on the superjunction effect of his invention. U.S. Pat. Nos. 6,410,958, 6,300,171 and 6,307,246 are examples of such efforts and are incorporated by reference herein.

Trench-type superjunction devices are expected to replace multi-epi superjunction devices because of the potential lower processing cost. FIG. 1A illustrates an enlarged partial cross-sectional view of a wafer 10 having a first main surface 2 and a second main surface 4. The wafer 10 includes a semiconductor substrate region 3 with an upper surface 6. A semiconductor material layer 5 is disposed adjacent the upper surface 6 of the substrate region 3. A layer of dielectric material or oxide 14 is disposed on the first main surface 2. A trench 12 is formed in the semiconductor material layer 5 extending to a depth D from the first main surface 2 toward the substrate region 3, exposing a portion of the upper surface 6.

In superjunction metal-oxide semiconductor field-effect-transistor (MOSFET) manufacturing, typically the trenches 12 are etched, sidewalls of the trenches 12 are doped to form columns of n or p type (not shown), and the trenches 12 are refilled. The depth of the trenches 12 is critical to performance and reliability of the end devices derived from the wafer 10. The depth D preferably penetrates the semiconductor material layer 5 to expose the upper surface 6 of the substrate region 3. For example, FIG. 1B illustrates a wafer 10 wherein a trench 12s has been formed in the semiconductor material layer 5, but the depth $D_s$ is too shallow and does not reach the upper surface 6 of the substrate region 3. Conversely, FIG. 1C illustrates a wafer 10 wherein a trench 12d has been formed in the semiconductor material layer 5, but the depth $D_d$ is too deep and penetrates the upper surface 6, extending partially into the substrate region 3. In either of the examples of FIGS. 1B and 1C, sidewall doping will be affected, thereby resulting in decreased performance and reliability.

The depth of relatively larger trenches 12 may be measured using non-contact metrology. For example, the depth of a trench 12 having a width of 10 micrometers (μm) may be assessed using an optical profiler. However, as the trenches 12 become narrower, at a width of 4 μm for example, the depth can only be measured via destructive analysis techniques, such as the use of a scanning electron microscope (SEM). By destroying a portion of the wafer 10, the yield is thereby decreased.

In addition to superjunction devices, the development of microelectromechanical systems (MEMS) technology has provided the ability to combine microelectronic circuits and mechanical parts, such as cantilevers, membranes, holes, and the like, onto a single chip. MEMS chips may be developed to provide, for example, inertia sensors (e.g., for use in an accelerometer), radio frequency (RF) switches, and pressure sensors, and may also be used in optics applications, such as for digital light processing (DLP) televisions. The depth of trenches formed on MEMS chips is therefore also critical for proper functionality.

It is desirable to provide a method of manufacturing trench-type superjunction devices and MEMS whereby the trench depth may be accurately monitored without unnecessary destructive measurement analysis, thereby increasing wafer yield.

BRIEF SUMMARY OF THE INVENTION

Briefly stated, embodiments of the present invention comprise a method of manufacturing a semiconductor wafer having at least one device trench extending to a first depth position. The method includes providing a semiconductor substrate having first and second main surfaces and a semiconductor material layer having first and second main surfaces disposed on the first main surface of the semiconductor substrate. An etch ratio is determined. The at least one device trench and at least one monitor trench are simultaneously formed from the first main surface of the semiconductor material layer. The method further includes detecting whether the at least one monitor trench extends to a second depth position. A ratio of the first depth position to the second depth position is generally proportional to the etch ratio. Preferably, a ratio of the first depth position to the second depth position is generally equal to the etch ratio.

Another embodiment of the present invention comprises a method of manufacturing a semiconductor wafer having at least one device trench extending to a first depth position. The method includes providing a semiconductor substrate having first and second main surfaces and a semiconductor material layer having first and second main surfaces disposed on the first main surface of the semiconductor substrate. An etch ratio is determined. The at least one device trench and at least one monitor trench are simultaneously formed from the first main surface of the semiconductor material layer. A depth of the at least one monitor trench is monitored. Formation of the at least one device trench and the at least one monitor trench ceases upon attainment by the at least one monitor trench of a second depth position. A ratio of the first depth position to the second depth position is generally equal to the etch ratio.

A still further embodiment of the present invention comprises a semiconductor wafer including a semiconductor substrate having first and second main surfaces opposite to each other. A semiconductor material layer having first and second main surfaces opposite to each other is disposed on the first main surface of the semiconductor substrate. At least one device trench extends from the first main surface of the semiconductor layer to a first depth position. At least one monitor trench extends from the first main surface of the semiconductor layer to a second depth position. A ratio of the first depth position to the second depth position is predetermined such that a depth of the at least one device trench is determined by measuring a depth of the at least one monitor trench.

BRIEF DESCRIPTION OF THE DRAWINGS

The foregoing summary, as well as the following detailed description of preferred embodiments of the invention, will be better understood when read in conjunction with the appended drawings. For the purpose of illustration, there are shown in the drawings embodiments which are presently preferred. It should be understood, however, that the invention is not limited to the precise arrangements and instrumentalities shown.

In the drawings:

FIG. 4 is an enlarged partial cross-sectional elevational view of a test wafer in accordance with a preferred embodiment of the present invention;

FIG. 5A is a top plan view of a wafer having a die layout in accordance with a preferred embodiment of the present invention;

FIG. 5B is an enlarged top plan view of a die from the wafer of FIG. 5A in accordance with a preferred embodiment of the present invention; and FIG. 5C is an enlarged top plan view of a process control module (PCM) from the wafer of FIG. 5A in accordance with a preferred embodiment of the present invention.

DETAILED DESCRIPTION OF THE INVENTION

Figure 1A:
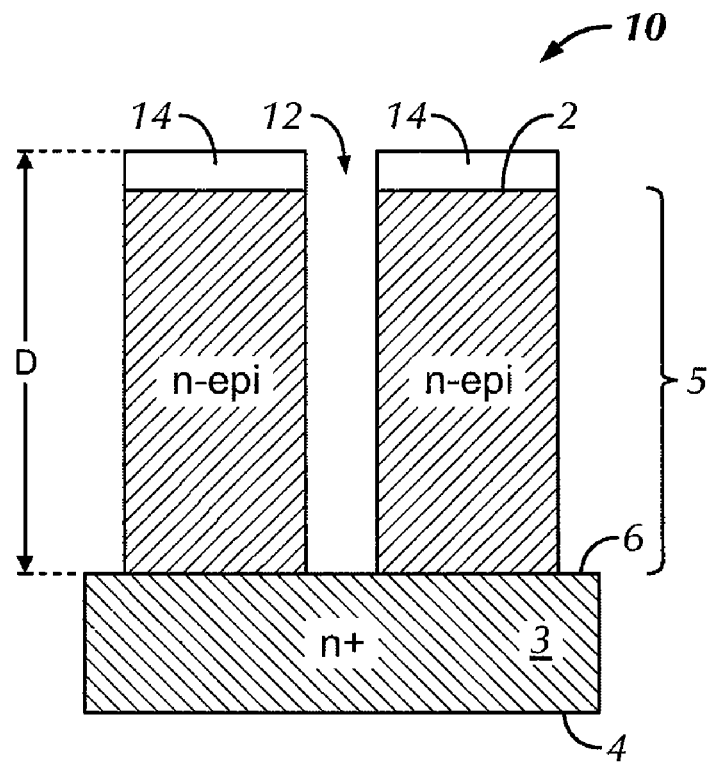
FIG. 1A is an enlarged partial cross-sectional elevational view of a prior art semiconductor wafer following formation of a trench therein.
Figure 1B:
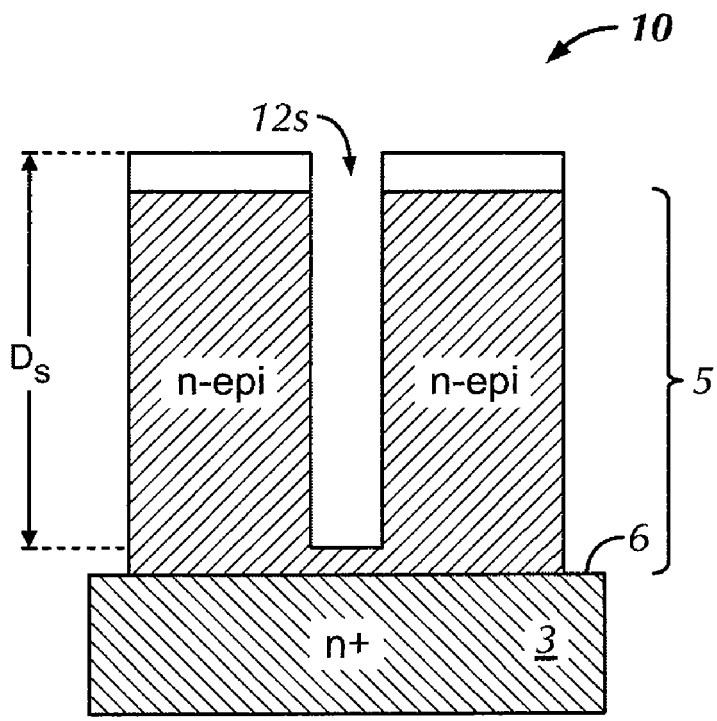
FIG. 1B is an enlarged partial cross-sectional elevational view of a prior art semiconductor wafer having a trench formed therein that is shallower than desired.
Figure 1C:
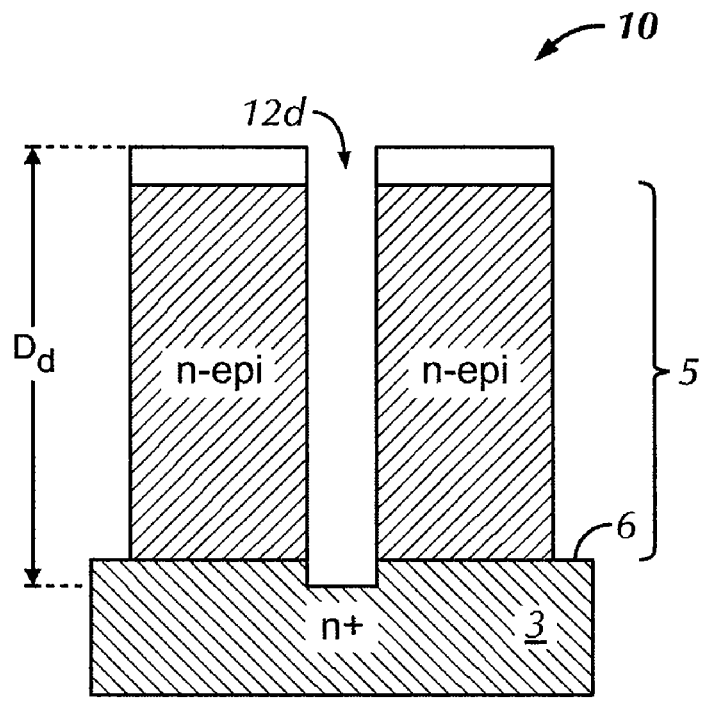
FIG. 1C is an enlarged partial cross-sectional elevational view of a prior art semiconductor wafer having a trench formed therein that is deeper than desired.

Certain terminology is used in the following description for convenience only and is not limiting. The words "right", "left", "lower", and "upper" designate directions in the drawings to which reference is made. The words "inwardly" and "outwardly" refer to directions toward and away from, respectively, the geometric center of the device and designated parts thereof. The terminology includes the above-listed words, derivatives thereof, and words of similar import. Additionally, the words "a" and "an", as used in the claims and in the corresponding portions of the specification, mean "at least one."

As used herein, reference to conductivity will be limited to the embodiment described. However, those skilled in the art know that p-type conductivity can be switched with n-type conductivity and the device would still be functionally correct (i.e., a first or a second conductivity type). Therefore, where used herein, reference to n or p can also mean either n or p or p and n can be substituted therefor.

Furthermore, $n^+$ and $p^+$ refer to heavily doped n and p regions, respectively; $n^{++}$ and $p^{++}$ refer to very heavily doped n and p regions, respectively; $n^-$ and $p^-$ refer to lightly doped n and p regions, respectively; and $n^{--}$ and $p^{--}$ refer to very lightly doped n and p regions, respectively. However, such relative doping terms should not be construed as limiting.

Referring to the drawings in detail, wherein like reference numerals indicate like elements throughout, there is shown in FIG. 5A a top plan view of a wafer 510 manufactured in accordance with preferred embodiments of the present invention. A cross-section of the wafer 510 exhibits the same layer structure as shown in FIG. 1A, including first and second main surfaces 2, 4, a semiconductor substrate 3 with upper surface 6, a semiconductor material layer 5 deposited on the upper surface 6, and an oxide layer 14. At least one device trench 512 (FIG. 5B) and at least one monitor trench 530 (FIG. 5C) are formed in the semiconductor material layer 5 extending from the first main surface 2. Both the device trench 512 and the monitor trench 530 are preferably formed using reactive ion etching (RIE), and more preferably, using deep RIE techniques. FIGS. 5A-5C will be described in more detail below.

Figure 2:
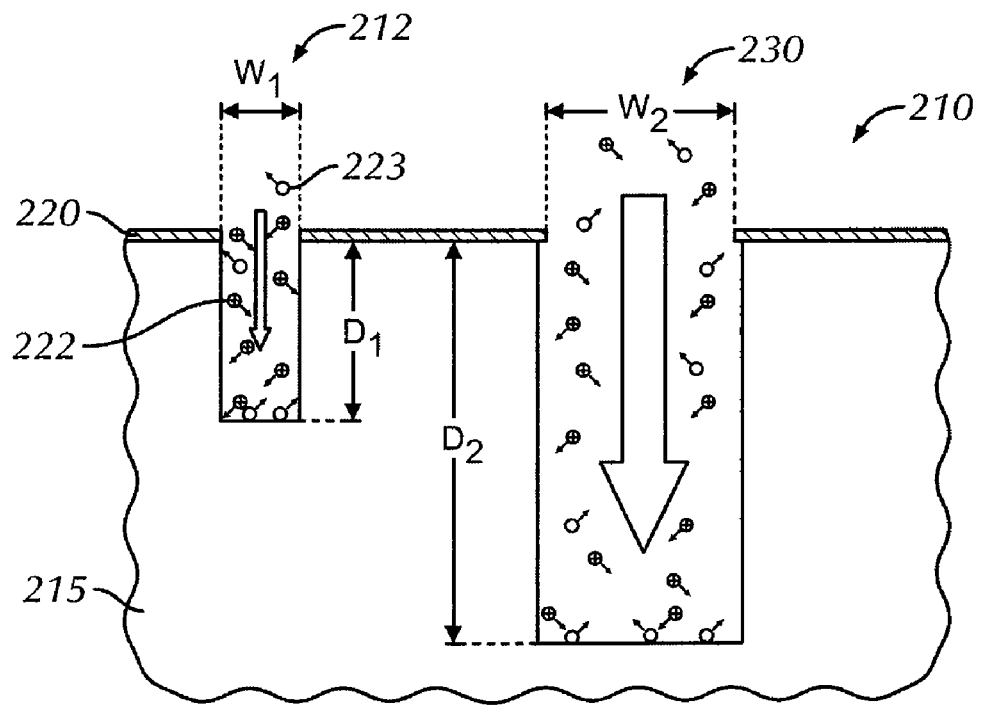
FIG. 2 is an enlarged partial cross-sectional elevational view of a prior art semiconductor wafer during a reactive ion etching process showing different sized trenches.

FIG. 2 illustrates a typical RIE process. RIE utilizes an ionized gas, or plasma, to remove material 215 from the wafer 210. High energy ions 222 of plasma bombard the wafer 210 and react with the material 215. A layer of photoresistive material 220, which protects portions of the wafer 210 during the RIE process, is deposited over the material 215 to form the pattern to be etched onto the wafer 210. Typically, the wafer 210 is placed in a chamber with an apparatus for generating a strong radio frequency (RF) electromagnetic field. A gas is passed into the chamber at a low pressure and is then ionized by the RF field. An inductively coupled plasma (ICP) is preferably used for the deep RIE process described herein. The ICP is generated using an RF powered magnetic field. The gas selection and amount varies depending on the material 215 to be etched. For example, sulfur hexafluoride $SF_6$ may be used to etch silicon. Etch by-product 223 may also be generated.

An etch rate during deep RIE is generally affected by several variables. Etch chemistry and process conditions have a large impact on the etch rate. The reaction between the material 215 and the ions 222 of the ICP determines how quickly a trench 212 may be formed and, therefore, selection of the appropriate gas and material 215 is essential. Similarly, the power supplied to the RF field, the pressure in the chamber, the gas flow, or like processes impact the speed of the etchant. The pattern density on the wafer 210 and the feature aspect ratio also affect the etch rate. A higher density of features, such as the trenches 212, 230 results in a smaller etch rate. The feature aspect ratio is a ratio of the length of the feature to the width of the feature. Trenches 212 with lower aspect ratios etch faster than trenches 230 with higher aspect ratios.

Finally, the etch rate is affected by the feature size, or in the example of FIG. 2, the widths $W_1$, $W_2$ of the respective trenches 212, 230. As a general rule, smaller trenches 212 etch at a slower rate than larger trenches 230 because more etchant can access the larger trench 230. This phenomenon is referred to as RIE lag. For example, the trench 230 reaches a depth of $D_2$ in the same amount of time it takes the trench 212 to reach a depth of $D_1$. Using the principle of RIE lag, a larger trench 230 (i.e., having a width $W_2$ greater than $W_1$) can be used to calibrate a smaller trench 212 if an etch ratio can be determined. The etch ratio is generally determined by a ratio of the width $D_1$ of the smaller trench 212 to the width $D_2$ of the larger trench 230.

Figure 3:
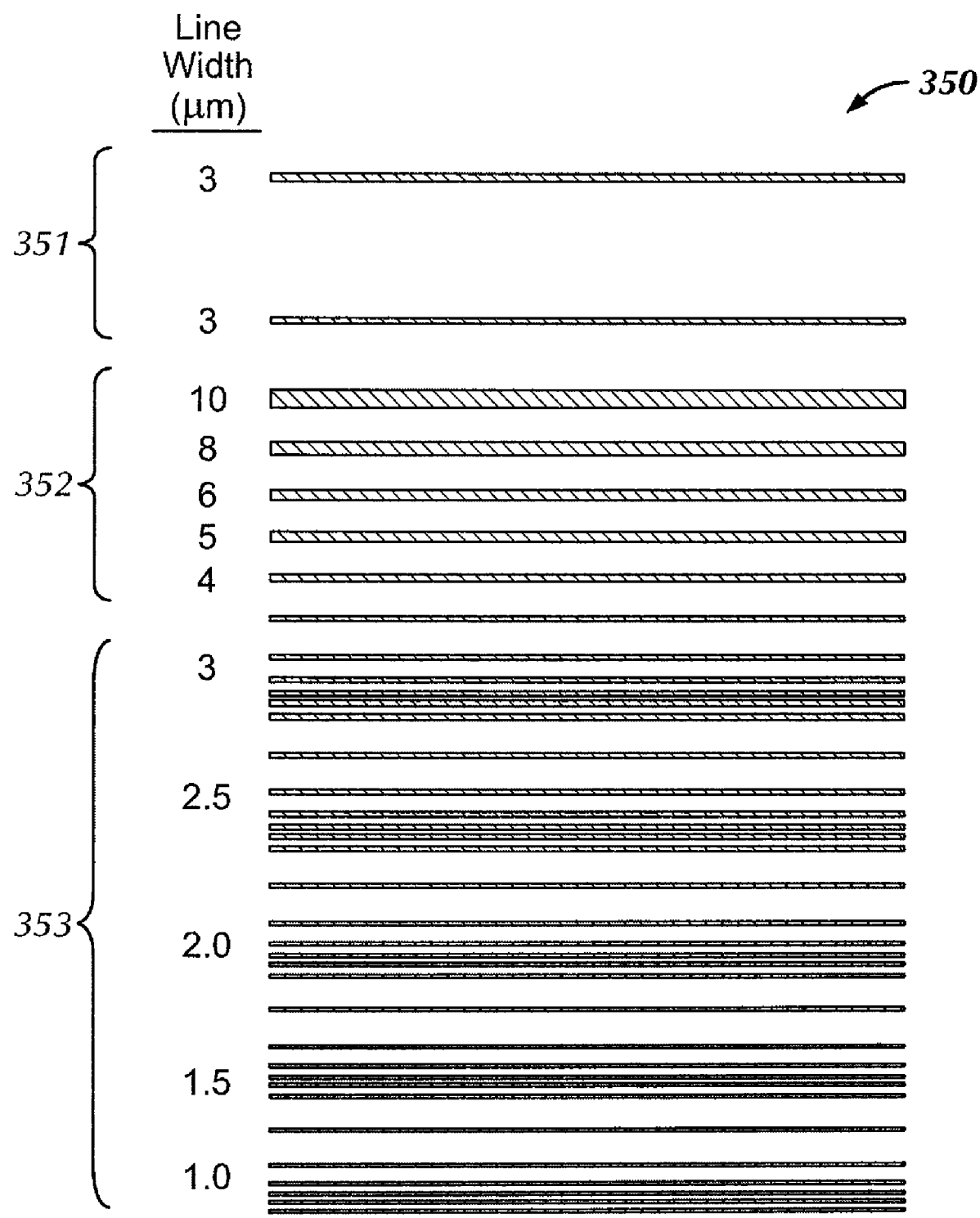
FIG. 3 is a top plan view of a pattern for use on a test wafer for determining an etch ratio.

Referring to FIG. 3, an exemplary pattern 350 is illustrated for use on a test wafer (FIG. 4) prior to batch production. The pattern 350 includes three trench sets 351, 352, 353 for calculating an etch ratio. The first trench set 351 includes two trenches of 3 μm width spaced at 40 and 80 μm. The second trench set 352 includes five individual trenches of 4, 5, 6, 8, and 10 μm spaced at 20 μm each. The third trench set 353 includes groups of trenches of 1.0, 1.5, 2.0, 2.5, and 3.0 μm, each group having variable spacing at 20, 10, 5, 3, 5, and 20 μm. One skilled in the art will recognize that any number of trenches or other features of various widths and orientations may be implemented in the pattern 350 for etch ratio determination.

Referring to FIG. 4, trenches are etched into the test wafer 410t according to the pattern 350 and the depths of the various trenches on the test wafer 410t are then determined by excising a cross-sectional portion of the test wafer 410t for SEM analysis. FIG. 4 shows two trenches 412t, 430t having widths of 4 µm and 10 µm respectively, which are chosen, for purposes of example, to correspond to the widths of the trenches 512, 530 in the device wafer 510. The width for use in a monitor trench 530 is preferably selected such that non-destructive analysis, such as by an optical profiler, may be used to measure depth. A width for use in a device trench 512 may also be determined by the test wafer. The respective depths on the test wafer 410t are compared to determine the etch ratio.

For example, in FIG. 4, the 10 µm trench 430t extends from the first main surface 402t of the semiconductor material layer 405t to a depth of X (µm). The 4 µm trench 412t is similarly formed on the test wafer 410t. The depth of the 4 µm trench 412t is measured as 0.8×. The depth measurements of the trenches 412t, 430t on the test wafer 410t may be made by SEM analysis. The etch ratio is thus determined to be 0.8 and may be applied to similarly formed trenches 512, 530 on the device wafer 510. Thus, if the desired depth of the device trench 512 is D, then the monitor trench 530 depth is generally equal to D/0.8. As described earlier with respect to FIG. 1A, it is preferable that the device trench 512 extend from the first main surface 2 of the wafer 510 to the upper surface 6 of the semiconductor substrate 3.

The wafer 510 shown in FIGS. 5A-5C as being manufactured in accordance with a preferred embodiment of the present invention preferably includes a plurality of dies 560. Each die 560 may be intended for use in a superjunction device, (e.g., a superjunction field-effect-transistor (FET)), MEMS, or other semiconductor device. A number of devices may also be included in each die area 560. The dies 560 therefore include the device trenches 512. In addition, one or more process control modules (PCMs) 561 are distributed on the wafer 510. A PCM 561 is an area set aside on the wafer 510 for testing and detecting flaws that may affect nearby dies 560. One or more monitor trenches 530 are located in each PCM 561 to avoid wasting usable space of the die 560. In an alternative arrangement, the PCM 561 may be located in a dicing path (the space between dies 560 for allowing each die to be cut away individually). The monitor trench 530 may also be placed in the dicing path PCM 561.

During processing of the wafer 510, the monitor trench 530 may be utilized in a number of ways to ensure proper depth of the device trench 512. In one preferred embodiment, the trenches 512, 530 are simultaneously etched. Once etching is complete, the monitor trench 530 is assessed by way of, for example, an optical profiler, as described above. If the depth of the monitor trench 530 indicates, based on the predetermined etch ratio, that the device trench 512 is at the proper depth, processing continues. If the depth of the monitor trench 530 indicates, based on the predetermined etch ratio, that the device trench 512 is at a depth less than the desired depth, the wafer 510 is replaced for further etching.

Alternatively, the monitor trench 530 may be continuously measured during the etching process such that etching ceases upon attainment of a depth by the monitor trench 530 that indicates, based on the etch ratio, that the device trench 512 is at the proper depth. Endpoint detection of the monitor trench 530 may be carried out, for example, using one or more laser sources located in the chamber. Laser light reflected off the bottom of the trench 530 and the first main surface 2 are compared to determine the relative trench 530 depth via, for example, interferometry, polarimetry, or the like. Other techniques for determining the trench monitor 530 depth, either by continuous or discrete measurements, may be used without departing from embodiments of the present invention.

The trench 512, 530 designs are not limited to rectangles. Many other trench shapes such as ovals, circles, polygons, non-geometric shapes, dog-bones, rectangles with rounded ends, or crosses are also possible. The trench shapes and orientations may be changed so as to fit a process specifically designed for superjunction devices, MEMS, or other semiconductor devices. However, the number and locations of the trenches 512 may affect overall device efficiency. Additionally, the width of the monitor trench 530 may be increased or decreased depending on the equipment available for accurate depth measurement by non-destructive methods.

The monitor trench 530 may also be used to conveniently determine a depth of other trenches 512 that are identically sized to the monitor trench 530 or have larger widths and/or depths than the monitor trench 530. For example, a very wide trench 512 may be etched on the wafer 510. Rather than reposition the wafer 510 or measuring instrument (not shown) for determining the depth of the very wide trench 512, the depth of the monitor trench 530 may be measured, provided the etch ratio of the two trenches 512, 530 is known. Consequently, a wafer 510 may include a number of trenches 512 with greatly varying widths and/or depths, and the monitor trench 530 may be used to determine the depth of each trench 512, provided that the etch ratio for each trench 512 is known.

It will be appreciated by those skilled in the art that changes could be made to the embodiments described above without departing from the broad inventive concept thereof. It is understood, therefore, that the invention is not limited to the particular embodiments disclosed, but it is intended to cover modifications within the spirit and scope of the present invention as defined by the appended claims.

We claim:

1. A method of manufacturing a semiconductor wafer having at least one device trench, the at least one device trench having a first depth position, the method comprising:
   (a) providing a semiconductor substrate having first and second main surfaces and a semiconductor material layer disposed on the first main surface of the semiconductor substrate, the semiconductor material layer having first and second main surfaces;
   (b) pre-determining an etch ratio by
      (i) forming, in a test wafer, at least one first trench having a first width and at least one second trench having a second width, the first and second widths being different, and
      (ii) measuring a first depth of the at least one first trench and a second depth of the at least one second trench to thereby calculate the etch ratio based on the first and second widths;
   (c) simultaneously forming in the semiconductor substrate
      (i) the at least one device trench from the first main surface of the semiconductor material layer, the at least one device trench having the first width, and
      (ii) at least one monitor trench from the first main surface of the semiconductor material layer; the at least one monitor trench having the second width, and
   (d) detecting with an optical profiler whether the at least one monitor trench extends to a second depth position, a ratio of the first depth position to the second depth position being generally equal to the etch ratio.

2. The method of claim 1, wherein the second width is greater than the first width.

3. The method of claim 1, further comprising:
   (e) forming at least one die on the semiconductor wafer; and
   (f) forming at least one process control module (PCM) on the semiconductor wafer.

4. The method of claim 3, further comprising:
(g) forming the at least one device trench in the at least one die; and
(h) forming the at least one monitor trench in the PCM.

5. The method of claim 1, further comprising:
(e) when detection indicates that the at least one monitor trench extends to a depth less than the second depth position, repeating steps (c) and (d).

6. The method of claim 1, wherein the first width is greater than the second width.

7. The method of claim 1, wherein the at least one device trench and the at least one monitor trench are formed by the same process.

8. The method of claim 1, wherein the steps (a)-(d) are performed sequentially.

9. The method of claim 1, wherein prior to commencement of each of the steps (a)-(d), the respective preceding step is substantially completed.

10. The method of claim 1, wherein prior to commencement of each of the steps (a)-(d), the respective preceding step is fully completed.

11. The method of claim 1, wherein the first depth position extends to the first main surface of the semiconductor substrate.

12. A method of manufacturing a semiconductor wafer having at least one device trench, the at least one device trench having a first depth position comprising:
(a) providing a semiconductor substrate having first and second main surfaces and a semiconductor material layer disposed on the first main surface of the semiconductor substrate, the semiconductor material layer having first and second main surfaces;
(b) pre-determining an etch ratio by
  (i) forming, in a test wafer, at least one first trench having a first width and at least one second trench having a second width, the first and second widths being different, and
  (ii) measuring a first depth of the at least one first trench and a second depth of the at least one second trench to thereby calculate the etch ratio based on the first and second widths;
(c) simultaneously forming in the semiconductor substrate
  (i) the at least one device trench from the first main surface of the semiconductor material layer, the at least one device trench having the first width, and
  (ii) at least one monitor trench from the first main surface of the semiconductor material layer, the at least one monitor trench having the second width;
(d) monitoring a depth of the at least one monitor trench using an optical profiler; and
(e) ceasing formation of the at least one device trench and the at least one monitor trench upon attainment by the at least one monitor trench of a second depth position, a ratio of the first depth position to the second depth position being generally equal to the etch ratio.

13. The method of claim 12, wherein the second width is greater than the first width.

14. The method of claim 12, further comprising:
(f) forming at least one die on the semiconductor wafer; and
(g) forming at least one process control module (PCM) on the semiconductor wafer.

15. The method of claim 14, further comprising:
(h) forming the at least one device trench in the at least one die; and
(i) forming the at least one monitor trench in the PCM.

16. The method of claim 12, wherein the first width is greater than the second width.

17. The method of claim 12, wherein the at least one device trench and the at least one monitor trench are formed by the same process.

18. The method of claim 12, wherein the steps (a)-(e) are performed sequentially.

19. The method of claim 12, wherein prior to commencement of each of the steps (a)-(e), the respective preceding step is substantially completed.

20. The method of claim 12, wherein prior to commencement of each of the steps (a)-(e), the respective preceding step is fully completed.

21. The method of claim 12, wherein the first depth position extends to the first main surface of the semiconductor substrate.

22. A method of manufacturing a semiconductor wafer having at least one device trench, the at least one device trench having a first depth position, the method comprising:
(a) providing a semiconductor substrate having first and second main surfaces and a semiconductor material layer disposed on the first main surface of the semiconductor substrate, the semiconductor material layer having first and second main surfaces;
(b) pre-determining an etch ratio by
  (i) forming, in a test wafer, at least one first trench having a first width and at least one second trench having a second width, the first and second widths being different, and
  (ii) measuring a first depth of the at least one first trench and a second depth of the at least one second trench to thereby calculate the etch ratio based on the first and second widths;
(c) simultaneously forming in the semiconductor substrate
  (i) the at least one device trench from the first main surface of the semiconductor material layer, the at least one device trench having the first width, and
  (ii) at least one monitor trench from the first main surface of the semiconductor material layer, the at least one monitor trench having the second width; and
(d) detecting with an optical profiler whether the at least one monitor trench extends to a second depth position, a ratio of the first depth position to the second depth position being generally proportional to the etch ratio.

* * * * *